(12) United States Patent
Koyanagi

(10) Patent No.: US 7,129,876 B2
(45) Date of Patent: Oct. 31, 2006

(54) DIGITAL-ANALOG CONVERTER

(75) Inventor: Yukio Koyanagi, Saitama (JP)

(73) Assignee: Neuro Solution Corp., Tokyo (JP)

( * ) Notice: Subject to any disclaimer, the term of this patent is extended or adjusted under 35 U.S.C. 154(b) by 0 days.

(21) Appl. No.: 10/904,278

(22) Filed: Nov. 2, 2004

(65) Prior Publication Data

US 2005/0057386 A1 Mar. 17, 2005

Related U.S. Application Data

(63) Continuation of application No. PCT/JP03/05264, filed on Apr. 24, 2003.

(30) Foreign Application Priority Data

May 9, 2002 (JP) .................. 2002-134573

(51) Int. Cl.
H03M 1/66 (2006.01)

(52) U.S. Cl. ...................... 341/144; 341/143
(58) Field of Classification Search ............... 341/136, 341/120, 152, 144, 143; 327/311
See application file for complete search history.

(56) References Cited

U.S. PATENT DOCUMENTS

| 382,396 | A | * | 5/1888 | Lode ..................... 24/23 B |
| 3,940,673 | A | * | 2/1976 | Darlington ............... 318/584 |
| 4,028,694 | A | * | 6/1977 | Cook et al. .............. 341/136 |
| 4,118,697 | A | * | 10/1978 | Schlichte ................ 341/108 |
| 4,381,495 | A | * | 4/1983 | Hotta et al. .............. 341/120 |
| 4,571,572 | A | * | 2/1986 | Noda et al. .............. 341/126 |
| 4,703,308 | A | * | 10/1987 | Belcher ................. 341/144 |
| 4,859,883 | A | * | 8/1989 | Bradinal ................ 327/311 |
| 5,061,925 | A | * | 10/1991 | Sooch et al. ............. 341/120 |
| 5,245,344 | A | * | 9/1993 | Sooch ................... 341/150 |
| 5,245,345 | A | * | 9/1993 | Kohdaka et al. .......... 341/152 |
| 5,396,244 | A | * | 3/1995 | Engel ................... 341/143 |
| 5,696,509 | A |   | 12/1997 | Maejima |
| 5,920,273 | A | * | 7/1999 | Hirano .................. 341/144 |
| 5,999,580 | A | * | 12/1999 | Sakoda et al. ........... 375/354 |
| 6,320,528 | B1 | * | 11/2001 | Michel .................. 341/144 |
| 6,377,633 | B1 | * | 4/2002 | Schneider .............. 375/317 |
| 6,515,608 | B1 |   | 2/2003 | Koyanagi |

FOREIGN PATENT DOCUMENTS

| EP | 1 014 552 A1 | 6/2000 |
| EP | 1198065 | 4/2002 |
| JP | 02-151126 A | 6/1990 |
| WO | WO 00/79686 A1 | 12/2000 |

OTHER PUBLICATIONS

Sozanski, K. P. et al. Digital Control Circuit for Class–D Audio Power Amplifier. 32nd. Annual IEEE Powers Electronics Specialist Conference, PESC 2001, Conference Proceedings, Vancouver, Canada, Jun. 17–21, 2001. Annual Power Electronics Specialist Conference, New York, New York. IEEE, U.S., vol. 1 of 4 Conf. pp. 1245–1250.

* cited by examiner

Primary Examiner—Jean Bruner Jeanglaude
(74) Attorney, Agent, or Firm—Connolly Bove Lodge & Hutz LLP; Larry J. Hume

(57) ABSTRACT

A digital-analog converter includes a counter (13) for performing counting operation according to clocks (CK1, CK2), a comparator (12) for comparing the count value to a digital input value and outputting the clocks (CK1, CK2) until the values coincide, switches (SW1, SW2) which turn ON/OFF according to the clocks (CK1, CK2), and a capacitor (C1) which charges and discharges by utilizing constant current sources (21, 22) when the switches (SW1, SW2) are ON. A digital portion (10) including the comparator (12) and the counter (13) is completely separated from an analog portion (20) including the capacitor (C1) and the switches (SW1, SW2) and these portions are connected only by the clocks (CK1, CK2), so that the digital portion (10) and the analog portion (20) can be designed separately.

10 Claims, 6 Drawing Sheets

FIG. 2

| | COMP | |
|---|---|---|
| | a | b |
| A>B | 0 | 1 |
| A<B | 1 | 0 |
| A=B | 0 | 0 |

DIGITAL-ANALOG CONVERTER

CROSS REFERENCE TO RELATED APPLICATIONS

This Application is a Continuation of Application PCT/JP03/05264 filed on Apr. 24, 2003. This Application claims priority to Japanese Application 2002-134573 filed on May 9, 2002. The entire contents of each of these applications is incorporated herein by reference.

FIELD OF THE INVENTION

The present invention relates to a digital-analog converter (D/A converter) for converting discrete digital data into continuous analog signals.

BACKGROUND OF THE INVENTION

A D/A converter for converting discrete digital data into continuous analog signals can be a converter of ladder resistance network type, segment type, integral type, etc. A converter of ladder resistance network type is configured by combining a ladder-shaped resistance network with a plurality of analog switches, and retrieves analog output from the end of the resistance network by controlling the analog switch using a digital input value.

A converter of segment type is configured by $2^n$-1 constant current circuits, and obtains analog output by adding a current with the switch corresponding to the digital input value turned on. A converter of integral type integrates a constant current using a mirror integration circuit while counting a clock value specified by a digital input value using a counter, and the resultant integral value is obtained as analog output.

Normally, in analog signal processing, the concept of the analog technology such as the reflection and a delay of a signal, the consistency of a transmission line, etc. is to be applied to circuit design, and the circuit design cannot be performed ad in digital data processing. Therefore, to perform the analog signal processing, a circuit applicable to the analog technology is to be designed, and to perform the digital data processing, a circuit applicable to the digital technology is to be designed.

However, any type of the above-mentioned conventional D/A converter is configured by a digital portion and an analog portion in a random mixed manner in the entire process of inputting digital data and outputting an analog signal. Therefore, there has been the problem that it is very difficult to design a circuit appropriate for the analog signal processing and the digital data processing.

The present invention has been achieved to solve the above problem. It is an object of the present invention to completely separate the digital portion and analog portion thereby facilitating the designing of circuits suitable for the portions.

SUMMARY OF THE INVENTION

The digital-analog converter according to the present invention includes: clock generation means for generating a clock having a pulse depending on the input digital data; and analog voltage generation means for generating a voltage depending on the pulse of the clock generated by the clock generation means, and outputting the voltage as an analog signal.

In another aspect of the present invention, a converter includes: oversampling means for oversampling input digital data; clock generation means for generating a clock having a pulse depending on a value of oversample data generated by the oversampling means; and analog voltage generation means for generating a voltage depending on the pulse of the clock generated by the clock generation means, and outputting the voltage as an analog signal.

The oversampling means includes, for example, means for obtaining an interpolation value for the discrete data by performing a moving average arithmetic or a convolutional arithmetic on data of a basic waveform having the amplitude depending on the values of n pieces of discrete data.

According to another aspect of the present invention, a converter includes: a counter for performing a counting operation based on an externally provided clock; a comparator for comparing the count value of the counter with the value of input digital data, and outputting the clock until the both values match each other; a capacitor for charging and discharging power using a constant current supply; and a switch for turning on/off the connection between the constant current supply and the capacitor according to the clock output from the comparator.

According to a further aspect of the present invention, a converter includes an oversampling circuit for oversampling the input digital data, and the comparator compares the count value of the counter with the value of the oversample data generated by the oversampling circuit, and outputs the clock until the both values match each other.

The oversampling circuit includes, for example, a circuit for performing a moving average arithmetic or a convolutional arithmetic on data of a basic waveform having the amplitude depending on the values of n pieces of input discrete data.

According to a further aspect of the present invention, a converter includes: a selection circuit for selecting any of the input digital data and the oversample data generated by the oversampling circuit and outputting the selected data to the comparator based on a selecting clock supplied externally; and a clock generation circuit for generating the selecting clock for control of the selection circuit such that the input digital data can be selected at least during the period from input of the first digital data to the oversampling circuit to output of the data, and the oversample data can be selected after the passage of the period.

According to a further aspect of the present invention, a converter includes: a second constant current supply provided separately from the constant current supply; and a second switch for turning on/off the connection between the second constant current supply and the capacitor according to the selecting clock output from the clock generation circuit.

BRIEF DESCRIPTION OF THE DRAWINGS

FIG. 2 is an explanatory view showing the operation of the comparator according to the first and second embodiments of the present invention;

DETAILED DESCRIPTION OF THE PREFERRED EMBODIMENTS

First Embodiment

Figure 1:
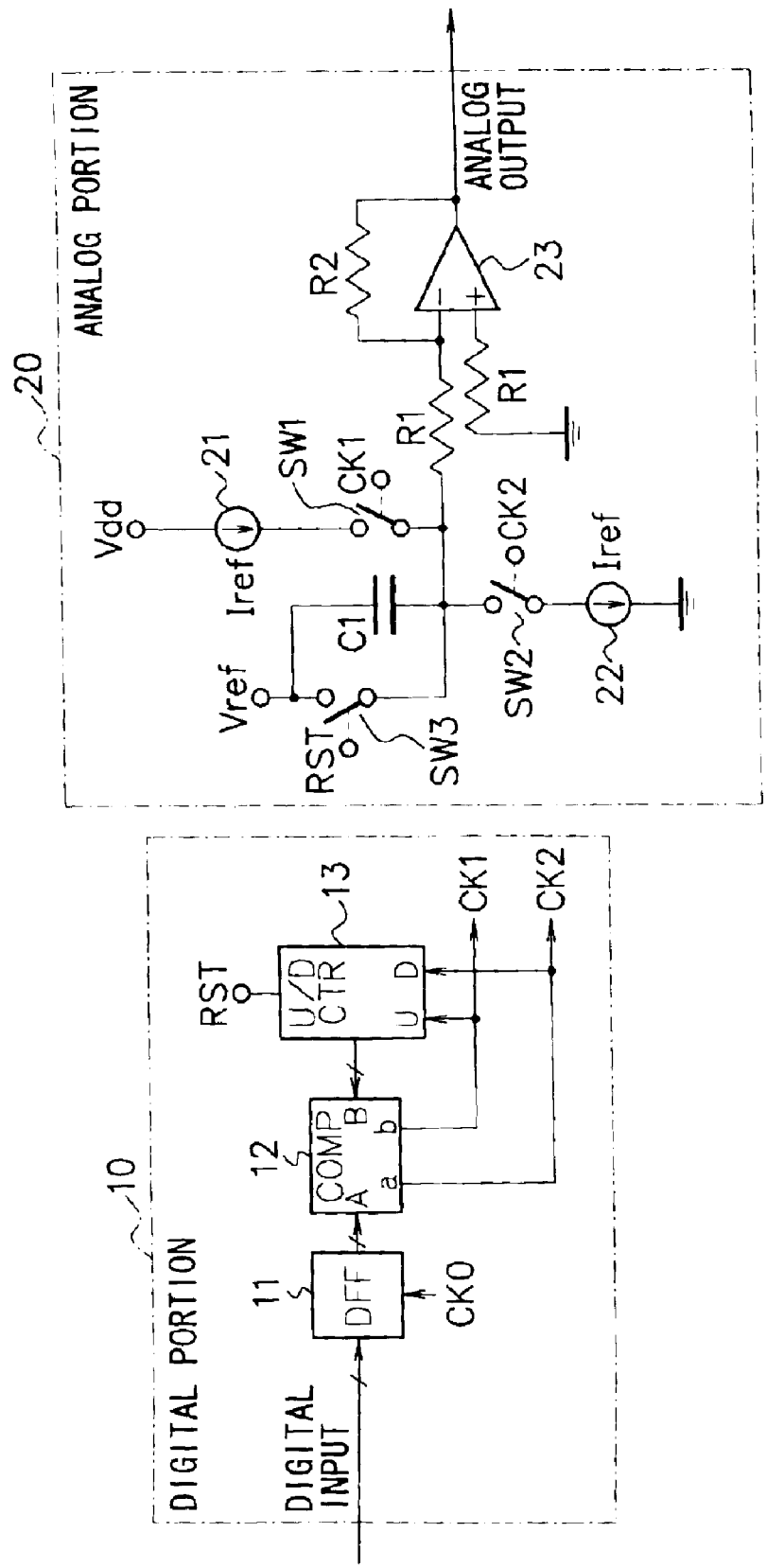
FIG. 1 shows the entire configuration of the D/A converter according to the first embodiment of the present invention.

Described first below is the first embodiment of the present invention. FIG. 1 shows an example of the configuration of the D/A converter according to the first embodiment of the present invention. As shown in FIG. 1, the D/A converter according to the present embodiment comprises a digital portion 10 and an analog portion 20 which are completely separated from each other.

The digital portion 10 comprises a D-type flip-flop 11, a comparator 12, and an up/down counter 13. The D-type flip-flop 11 stores for one clock period the input digital data according to a clock CK0 of a reference frequency.

Figure 2:
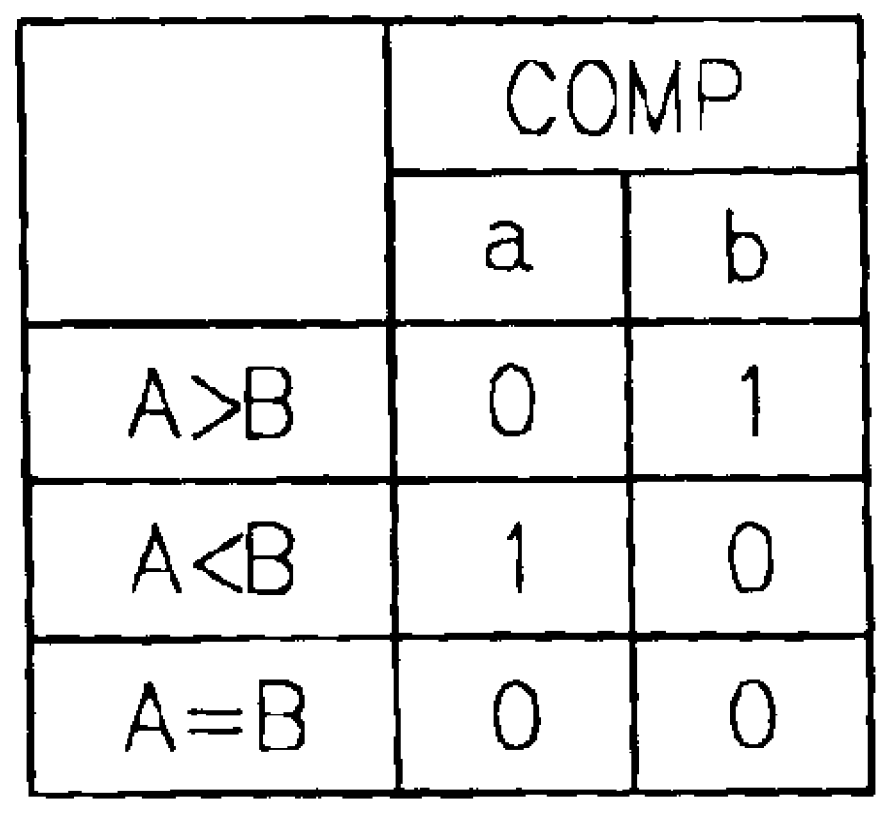

The comparator 12 compares the digital input value provided by a terminal A from the D-type flip-flop 11 with the count value provided by a terminal B from the up/down counter 13, and outputs the value of 0 or 1 depending on the comparison result from the terminal a or b. FIG. 2 shows the operation of the comparator 12.

As shown in FIG. 2, when the digital input value is larger than the count value, the values 0 and 1 are output from the terminals a and b. That is, only one pulse of a clock CK1 of a predetermined frequency is output. On the other hand, when the digital input value is smaller than the count value, the value of 1 and 0 is output from the terminal a and b. That is, one pulse of a clock CK2 at a predetermined frequency is output. Furthermore, when the digital input value is equal to the count value, none of the clocks CK1 and CK2 is output.

The up/down counter 13 resets the count value to 0 when a reset signal RST is input, and the clock is counted or counted down depending on the clocks CK1 and CK2 input to an up terminal U or a down terminal D. That is, the clock is counted each time the clock CK1 is input to the up terminal U while it is counted down each time the clock CK2 is input to the down terminal D. The resultant count value is output to the terminal B of the comparator 12.

By configuring the comparator 12 and the up/down counter 13 as described above, the clock is counted by the up/down counter 13 when the digital input value is larger than the count value at a certain point, and the clock CK1 is continuously output. Then, at a point when the digital input value becomes equal to the count value, the output of the clock CK1 stops.

When the digital input value is smaller than the count value at a certain point, the up/down counter 13 counts down the clock. During the period, the clock CK2 is repeatedly output. When the digital input value becomes equal to the count value, the output of the clock CK2 stops.

The analog portion 20 comprises a capacitor C1, three switches SW1 to SW3, two constant currents 21 and 22 for supplying a constant current Iref, resistors R1 and R2, and an output amplifier 23. The capacitor C1 accumulates a voltage depending on the digital input value.

Between the capacitor C1 and the supply of a reference voltage Vref, a third switch SW3 is connected parallel to the capacitor C1. The third switch SW3 is turned on when the same reset signal RST is supplied as the up/down counter 13, and the accumulated voltage of the capacitor C1 is reset to the reference voltage Vref.

Between the capacitor C1 and the supply of a power supply voltage Vdd, the first constant current 21 and the first switch SW1 are connected in series. The first switch SW1 is turned on/off depending on the clock CK1 output from the comparator 12, and is turned on when the pulse of the clock CK1 keeps a high level.

When the first switch SW1 is turned on according to the clock CK1, the first constant current 21 charges the capacitor C1, and the terminal voltage of the capacitor C1 gradually increases. As described above, the clock CK1 stops when the count value of the up/down counter 13 becomes equal to the digital input value. Therefore, the terminal voltage of the capacitor C1 increases up to the value depending on the digital input value, and then stops.

On the other hand, between the capacitor C1 and the ground, the second constant current 22 and the second switch SW2 are connected in series. The second switch SW2 is turned on/off depending on the clock CK2 output by the comparator 12, and is turned on when the pulse of the clock CK2 keeps the high level.

When the second switch SW2 is turned on according to the clock CK2, the accumulated charge of the capacitor C1 is extracted by the ground using the second constant current 22, and the terminal voltage of the capacitor C1 gradually drops. As described above, the clock CK2 is not output when the count value of the up/down counter 13 becomes equal to the digital input value. Therefore, the terminal voltage of the capacitor C1 stops after it drops down to the value depending on the digital input value.

Thus, the accumulated terminal voltage of the capacitor C1 is retrieved as the analog output by the output amplifier 23.

It is desired that the duty ratio between the clocks CK1 and CK2 output to the first and second switches SW1 and SW2 by the comparator 12 is fixed to 1:1 to maintain the constant increase/decrease rate (increase/decrease inclination).

As described above in detail, the D/A converter according to the present embodiment, the digital portion 10 and the analog portion 20 are completely separated, and they are connected only by the reset signal RST and the clocks CK1 and CK2. In this case, the up/down counter 13 is operated according to the clocks CK1 and CK2 of a fixed duty, and the capacitor C1 is charged and discharged according to the same clocks CK1 and CK2 so that the count value (digital amount) of the up/down counter 13 and the terminal voltage (analog amount) of the capacitor C1 can be operated corresponding to the ratio of 1:1, and the analog signal corresponding to the digital input value can be obtained.

Thus, according to the present embodiment, since the digital portion 10 can be completely separated from the analog portion 20, the digital portion 10 and the analog portion 20 can be individually designed. Thus, the circuit of the digital portion 10 can be designed as an appropriate circuit for the digital technology, and the circuit of the analog portion 20 can be designed as an appropriate circuit for the analog technology, thereby easily designing the circuit of a D/A converter.

In the first present embodiment, the clocks CK1 and CK2 have the number of pulses depending on the digital input value, and by repeatedly opening and closing the first and second switches SW1 and SW2 depending on the number of pulses, the terminal voltage of the capacitor C1 is stepwise increased and decreased. However, the present invention is not limited to this application. For example, by generating a clock having a pulse width depending on the digital input value, and turning on the first and second switches SW1 and SW2 during the period of the pulse width, the terminal voltage of the capacitor C1 can be linearly increased and decreased.

Second Embodiment

Figure 3:
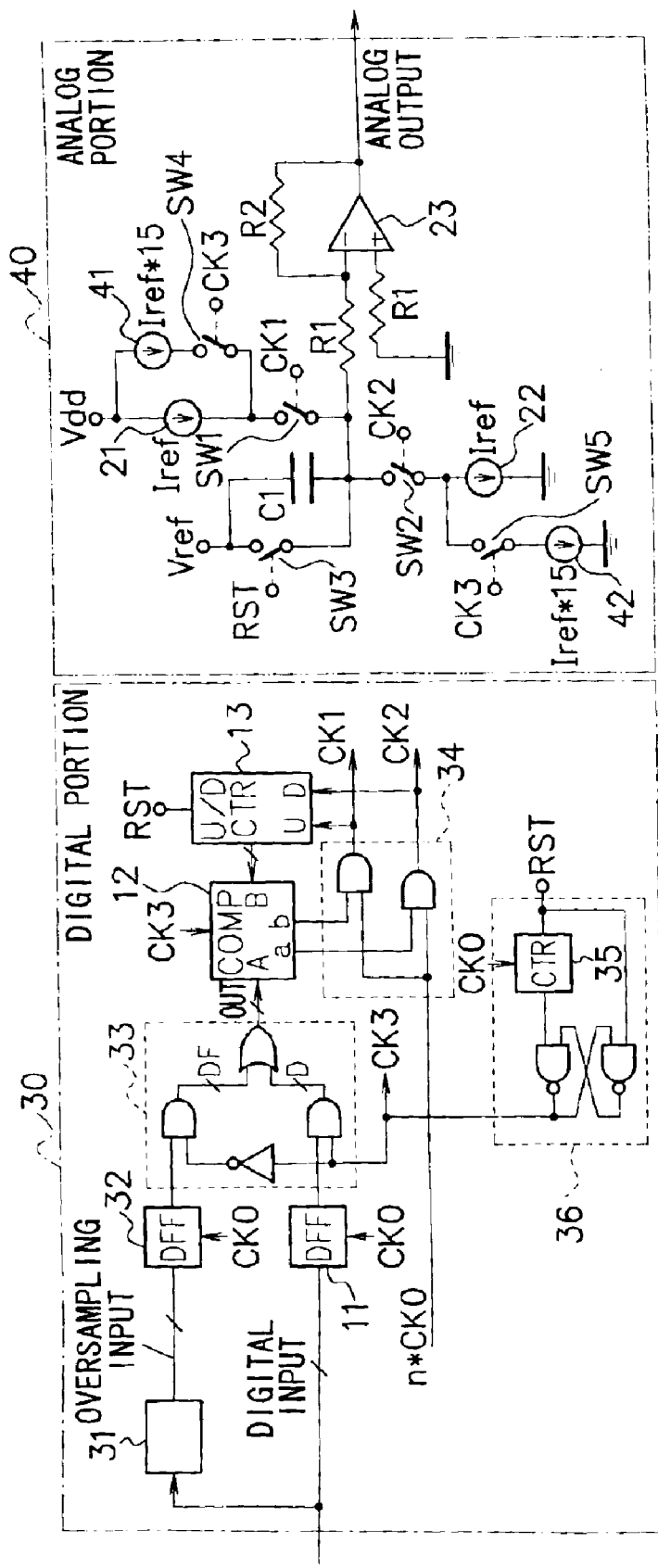
FIG. 3 shows an example of the configuration of the D/A converter according to the second embodiment of the present invention.

Described below is the second embodiment of the present invention. FIG. 3 shows an example of the configuration of the D/A converter according to the second embodiment. In FIG. 3, when a component is assigned the same reference numeral as the component shown in FIG. 1, the components have the same functions, and the overlapping explanation is omitted here.

As shown in FIG. 3, the D/A converter according to the second embodiment comprises a digital portion 30 completely separated from an analog portion 40. The digital portion 30 further comprises a clock generation circuit 36 including: in addition to the D-type flip-flop 11, the comparator 12, and the up/down counter 13, an oversample circuit 31, a D-type flip-flop 32, a selection circuit 33, an AND circuit 34, and a counter 35.

The oversample circuit 31 n times oversamples input digital data. The D-type flip-flop 32 holds the digital data oversampled by the oversample circuit 31 for one clock period according to the clock CK0 of the reference frequency. The selection circuit 33 selects any of the oversample data held by the D-type flip-flop 32 and the input digital data held by the D-type flip-flop 11, and outputs the selected data to the comparator 12.

The AND circuit 34 obtains the data of the comparison result output from the terminals a and b of the comparator 12, and the logical product of the n-times frequency clock (n*CK0), and outputs the results as the clocks CK1 and CK2. Therefore, the clocks CK1 and CK2 of the present embodiment are n times as large in frequency as those in the first embodiment.

The counter 35 is reset according to the reset signal RST, and performs the counting operation according to the clock CK0 of the reference frequency. The delay of the counter 35 is set equal to or longer than the time required by input digital data in passing the oversample circuit 31. The clock generation circuit 36 generates a clock CK3 having a pulse which enters the high level for the delay time of the counter 35, and outputs it to the selection circuit 33.

The selection circuit 33 selects the input digital data from the D-type flip-flop 11 when the clock CK3 keeps the high level, and selects the oversample data from the D-type flip-flop 32 when the clock CK3 keeps the low level.

That is, in the initial state in which, for example, immediately after powerup, etc., digital data has just been input, that is, in the period from the initial value of the digital data input to the oversample circuit 31 to the output with a delay, there is no guarantee of obtaining correct oversample data depending on the input digital data. Therefore, during the period, the input digital data is used as is, and after the period, the oversample data is converted into an analog signal.

By oversampling input digital data n times and performing D/A conversion, the quantization noise can be compressed to 1/n, thereby improving the S/N ratio. An example of the oversampling process is explained below. In the present embodiment, the oversampling technology described in Japanese Patent Application No. 11-173245, etc. filed by the Applicant.

Figure 4:
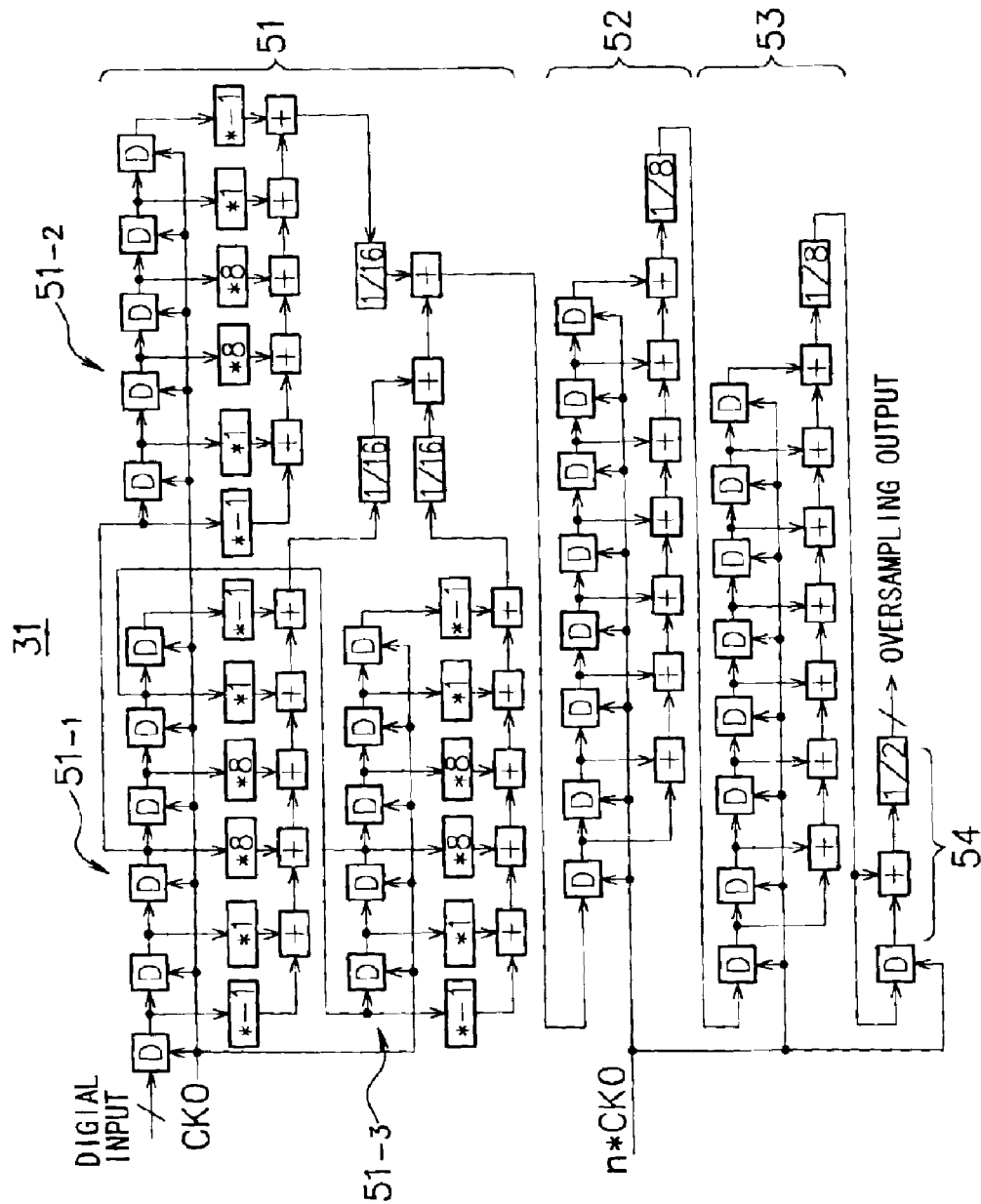
FIG. 4 shows an example of the configuration of the oversampling circuit according to the second embodiment of the present invention.

FIG. 4 shows an example of a configuration of the oversample circuit 31 used in the present embodiment. As shown in FIG. 4, the oversample circuit 31 comprises four convolution (moving average or convolution) arithmetic units 51 to 54. The first convolution arithmetic unit 51 is structured by three layers. Filter arithmetic units $51_{-1}$ to $51_{-3}$ of each layer are configured to have a plurality of D-type flip-flops, a plurality of coefficient units, a plurality of adders, and a 1/16-time multiplier.

In the first filter arithmetic unit $51_{-1}$ of the first layer, six serially connected D-type flip-flops sequentially delay the input digital data by one clock CK0. Then, the signal retrieved from the output tap of each D-type flip-flop is multiplied by six coefficient units by the coefficient of a basic digital waveform described below, and the multiplication results are added up by five adders. Then, the addition results are multiplied by 1/16 by the 1/16-time multiplier, and the amplitude is restored to the original level.

Figure 5:
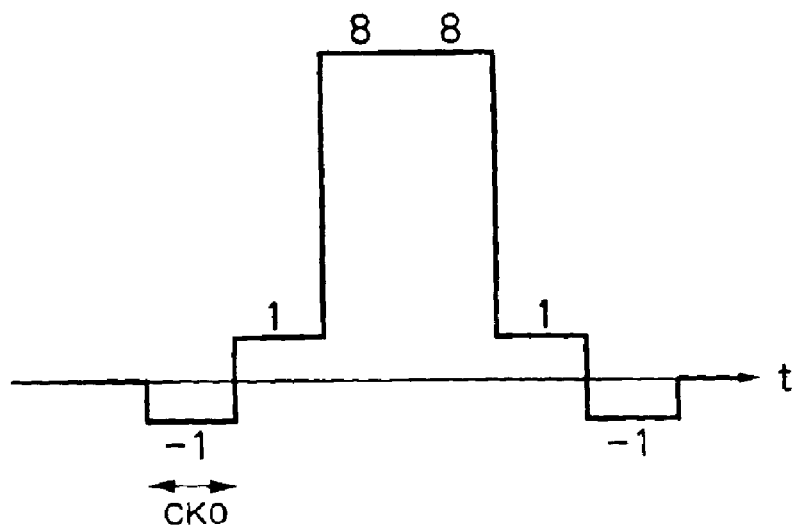
FIG. 5 shows the basic digital waveform used in the second embodiment of the present invention.

FIG. 5 is an explanatory view of the basic digital waveform according to the present embodiment. The basic digital waveform shown in FIG. 5 is the basic form of the sampling function to be used in the data interpolation by the oversampling. The basic digital waveform is generated by changing the data value into −1, 1, 8, 8, 1, −1 for each clock CK0 of the reference frequency.

In the second filter arithmetic unit $51_{-2}$ of the second layer, the signal retrieved from the output tap of the third D-type flip-flop provided in the first layer is sequentially delayed by one clock CK0 by serially connected five D-type flip-flops. Then, the signal retrieved from the input/output tap of each D-type flip-flop is multiplied by six coefficient units by the coefficient of a basic digital waveform described above, and the multiplication results are added up by five adders. Then, the addition results are multiplied by 1/16 by the 1/16-time multiplier, and the amplitude is restored to the original level.

In the third filter arithmetic unit $51_{-3}$ of the third layer, the signal retrieved from the output tap of the fifth D-type flip-flop provided in the first layer is sequentially delayed by one clock CK0 by serially connected five D-type flip-flops. Then, the signal retrieved from the input/output tap of each D-type flip-flop is multiplied by six coefficient units by the coefficient of a basic digital waveform described above, and the multiplication results are added up by five adders. Then, the addition results are multiplied by 1/16 by the 1/16-time multiplier, and the amplitude is restored to the original level.

In the first convolution arithmetic unit 51, all arithmetic results by the above-mentioned filter arithmetic unit $51_{-1}$ to $51_{-3}$ of the three layers are added up, and output to the second convolution arithmetic unit 52.

The second convolution arithmetic unit 52 comprises eight D-type flip-flops, seven adders, and a 1/8-time multiplier. The second convolution arithmetic unit 52 operates according to an n-times frequency clock (n*CK0). First, the digital data output by the first convolution arithmetic unit 51 is sequentially delayed by one clock (n*CK0) by serially connected eight D-type flip-flops.

Then, the signals retrieved from the output tap of each D-type flip-flop are added by the seven adders. The addition result is multiplied by 1/8 by the 1/8-time multiplier to restore the amplitude to the original level, and the result is output to the third convolution arithmetic unit 53.

The third convolution arithmetic unit 53 comprises eight D-type flip-flops, seven adders, and a 1/8-time multiplier. In the third convolution arithmetic unit 53, the digital data output by the second convolution arithmetic unit 52 is sequentially delayed by one clock (n*CK0) by serially connected eight D-type flip-flops.

Then, the signals retrieved from the output tap of each D-type flip-flop are added by the seven adders. The addition result is multiplied by ⅛ by the ⅛-time multiplier to restore the amplitude to the original level, and the result is output to the fourth convolution arithmetic unit 54.

The fourth convolution arithmetic unit 54 comprises a D-type flip-flop, an adder, and a ½-time multiplier. In the fourth convolution arithmetic unit 54, the digital data output by the third convolution arithmetic unit 53 is delayed by one clock (n*CK0) by one D-type flip-flop.

Then, after adding the signals before and after the delays are added by the adder, the addition result is multiplied by ½ by the ½-time multiplier to restore the amplitude to the original level, and the result is output as oversample data.

Figure 6:
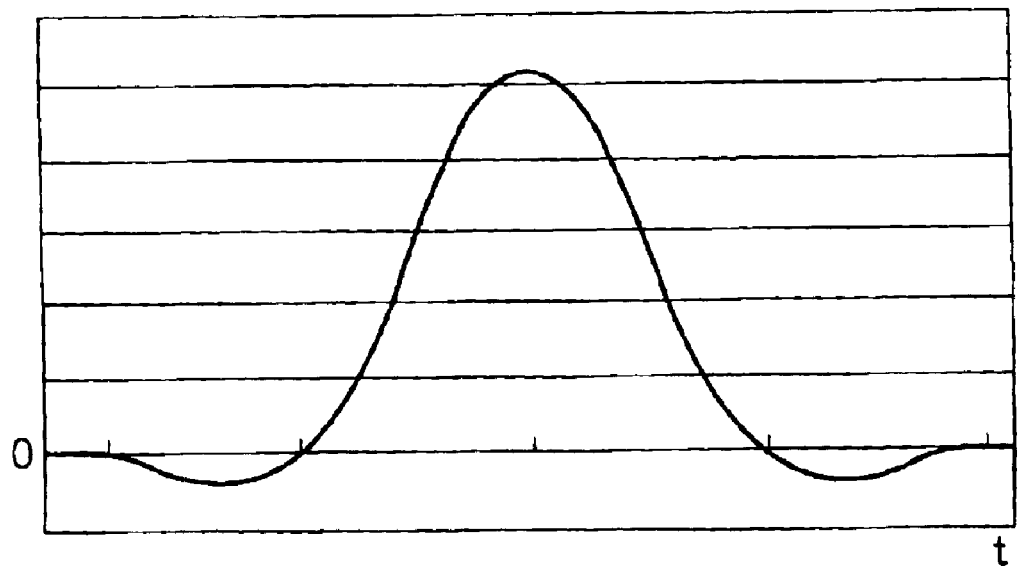
FIG. 6 shows the function generated from the basic digital waveform of the second embodiment.

When data of a single pulse is input to the oversample circuit 31 configured as described above, a signal of the waveform function as shown in FIG. 6 is obtained. The function shown in FIG. 6 can be differentiated once in the entire area, indicates a finite value other than 0 when the sampling position t along the horizontal axis is in a predetermined area, and indicates 0 (referred to as a finite base) in the other areas. The function shown in FIG. 6 is a sampling function indicating the maximum value only at one central sampling point, indicating the value of 0 at four sampling points, and passing all necessary sampling points to obtain a signal of a smooth analog waveform.

Therefore, by the oversample circuit 31 having the above-mentioned characteristics and performing an oversampling operation, a value between the discrete input digital data sampled by the clock CK0 of the reference frequency can be smoothly interpolated by the n-times frequency clock (n*CK0) using a function which can be differentiated once.

Since the sampling function shown in FIG. 6 converges to 0 at the finite sampling point, only the discrete data in the finite rage has to be taken into account unlike the sinc function (function converging to 0 at the sampling point of ±∞) commonly used in the conventional oversampling type D/A converter. That is, the interpolation is performed without disregarding the discrete data to be considered, and it is not necessary to theoretically consider the data. Therefore, no abort error occurs. As a result, more correct oversample data can be obtained, thereby improving the precision of the D/A conversion.

Figure 7:
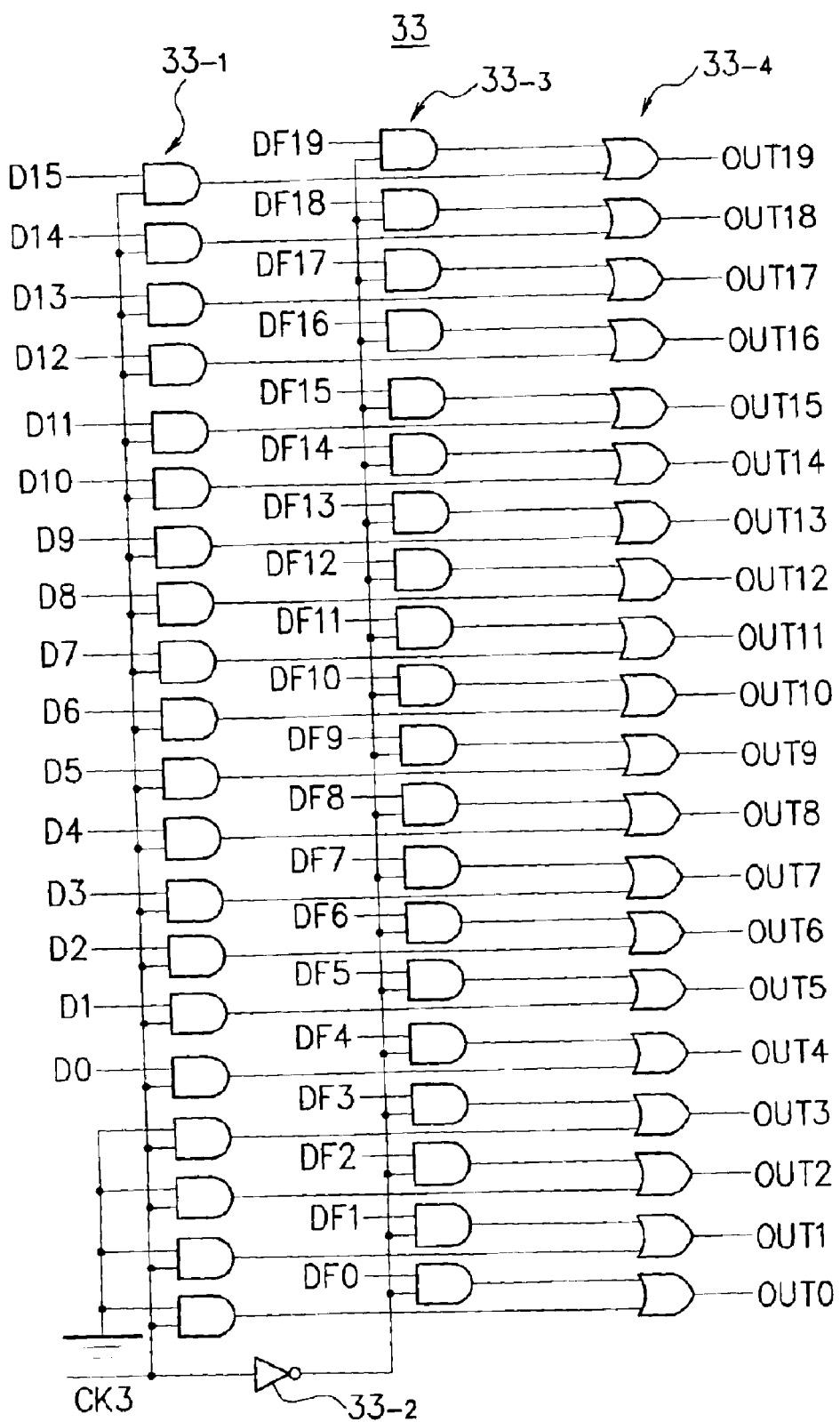
FIG. 7 shows an example of the detailed configuration of the selection circuit according to the second embodiment.

Described below is the configuration of the selection circuit 33. FIG. 7 shows in detail an example of the configuration of the selection circuit 33. In this example, the input digital data D is 16 bits which is oversampled and increased by 4 bits into 20 bits as the oversample data DF.

Thus, the input digital data D is different from the oversample data DF in number of bits. Therefore, as shown in FIG. 7, the input digital data D0 to D15 is set as upper 16 bits, and "0000" is added as lower 4 bits, thereby adjusting the number of bits into the same 20 bits as the oversample data DF0 to DF19.

Twenty (20) AND gate $33_{-1}$ obtain a logical product between the data of 20 bits including the input digital data D0 to D15 and the clock CK3, and output it to one input terminal of 20 OR gates $33_{-4}$. Likewise, 20 AND gate $33_{-3}$ obtain a logical product between 20-bit oversample data DF0 to DF19 and the clock CK3 which passes inverter $33_{-2}$, and output it to the other input terminal of the 20 OR gates $33_{-4}$.

Thus, when the clock CK3 keeps the high level, the 20-bit data including the input digital data D0 to D15 becomes active. When the clock CK3 keeps a low level, the 20-bit oversample data DF0 to DF19 becomes active. The 20 OR gates $33_{-4}$ output the active data to the comparator 12 shown in FIG. 3. The comparator 12 compares only the upper 16 bits of the input digital data input to the terminal A with the count value of the up/down counter 13 when the clock CK3 keeps the high level.

Described below is the configuration of the analog portion 40. The analog portion 40 further comprises: third and fourth constant currents 41 and 42 (corresponding to the second constant current supply according to the present invention) for supply of constant current (Iref*15) 15 times as large as the constant currents 21 and 22; and fourth and fifth switches SW4 and SW5 (corresponding to the second switch) in addition to the capacitor C1, the switches SW1 to SW3, the constant currents 21 and 22, the resistors R1 and R2, and the output amplifier 23 described above in the first embodiment of the present invention.

The fourth and fifth switches SW4 and SW5 are turned on/off according to the clock CK3 output by the clock generation circuit 36, and is turned on when the clock CK3 keeps the high level.

When the fourth and fifth switches SW4 and SW5 are turned off, the first and second constant currents 21 and 22 supply the same amount of constant current Iref as in the first embodiment. On the other hand, when the fourth and fifth switches SW4 and SW5 are turned on according to the clock CK3, 16 times the constant current is supplied to the first and second constant currents 21 and 22 and the third and fourth constant currents 41 and 42. Thus, the capacitor C1 is charged or discharged at a speed 16 times as high as the normal speed, and the terminal voltage of the capacitor C1 increases and decreases at a speed 16 times as high as the normal speed.

As described above by referring to FIG. 7, when the fourth and fifth switches SW4 and SW5 are turned on according to the clock CK3, the input digital data D0 to D15 are selected. However, 0 is added to the lower 4 bits, and the data is a total of 20 bits, which is larger than the original digital input value. Therefore, when the clock CK3 is turned on and the input digital data is selected in the initial status, the voltage value depending on the 20-bit input digital data can be quickly reached by charging and discharging the capacitor C1 at a high speed using the constant current 16 times as large as the normal current, thereby shortening the time required to enter the normal status of the capacitor C1.

As described above in detail, according to the second embodiment, the D/A conversion is performed on the input digital data after oversampling the data n times as much, thereby compressing the quantization noise into 1/n, and improving the S/N ratio. Furthermore, as an oversampling method, for example, the oversampling technology described in Japanese Patent Application No. 11-173245 can be used to smoothly interpolate input digital data, thereby obtaining more correct oversample data, and improving the precision of D/A conversion.

In the second embodiment, an example of using the oversampling technology described in Japanese Patent Application No. 11-173245 is described, but any other oversampling technology can be used.

In the second embodiment, the 15 times constant current (Iref*15) is supplied as the third and fourth constant currents 41 and 42, but the amount is not limited to 15 times.

The first and second embodiments are only practical examples of the present invention, and do not limit the technological scope of the present invention. That is, the present invention can be realized by various forms without deviation from the gist and the main characteristics of the present invention.

As described above, the present invention comprises clock generation means for generating a clock having the pulse depending on the value of input digital data, and analog voltage generation means for generating a voltage depending on the pulse of the clock. Therefore, a digital portion including the clock generation means and an analog portion including the analog voltage generation means can be separately provided, and the digital portion can be connected to the analog portion using the clock only. Thus, the digital portion and the analog portion can be separately designed. Therefore, the digital portion can design a circuit appropriate for the digital technology while the analog portion can design a circuit appropriate for the analog technology, thereby easily designing a circuit of a D/A converter.

INDUSTRIAL APPLICABILITY

The present invention is effective in completely separating a digital portion from an analog portion and easily designing a circuit appropriate for each portion.

What is claimed as new and desired to be protected by Letters Patent of the United States is:

1. A digital-analog converter, comprising:
   a counter that performs a counting operation responsive to an externally provided clock;
   a comparator that compares a count value of the counter with a value of input digital data, wherein the comparator outputs the clock until the count value of the counter and the input digital data value match each other;
   a capacitor that charges and discharges responsive to a constant current supply;
   a switch that turns a connection between the constant current supply and the capacitor on and off responsive to the clock output from the comparator;
   an oversampling circuit that oversamples the input digital data,
   wherein the comparator compares the count value of the counter with the value of the oversample data generated by the oversampling circuit, and outputs the clock until the count value and the oversample data value match each other;
   wherein the oversampling circuit comprises a circuit that performs a moving arithmetic average or a convolutional arithmetic operation on data of a basic waveform having an amplitude depending on values of n pieces of input discrete data.

2. The digital-analog converter according to claim 1, wherein data of a basic waveform is generated by sequentially changing the data value into -1, 1, 8, 8, 1, -1 for each clock cycle of a reference frequency.

3. A digital-analog converter, comprising:
   a counter that performs a counting operation responsive to an externally provided clock;
   a comparator that compares a count value of the counter with a value of input digital data, wherein the comparator outputs the clock until the count value of the counter and the input digital data value match each other;
   a capacitor that charges and discharges responsive to a first constant current supply;
   a switch that turns a connection between the constant current supply and the capacitor on and off responsive to the clock output from the comparator;
   an oversampling circuit that oversamples the input digital dataa,
   wherein the comparator compares the count value of the counter with the value of the oversample data generated by the oversampling circuit, and the outputs the clock until the count value and the oversample data value match each other;
   a selection circuit that selects any of the input digital data and the oversample data generated by the oversampling circuit responsive to an externally supplied selecting clock, wherein the selection circuit outputs the selected data to the comparator; and
   a clock generation circuit that generates the selecting clock that controls the selection circuit such that the input digital data is selected at least during a period from input of first digital data to the oversampling circuit to output of the data, and wherein the oversample data is selected after passage of the period.

4. The digital-analog converter according to claim 3, further comprising:
   a second constant current supply provided separately from the first constant current supply; and
   a second switch that turns a connection between the second constant current supply and the capacitor on and off responsive to the selecting clock output from the clock generation circuit.

5. A digital to analog converter, comprising:
   a digital portion comprising;
   a counter that performs a counting operation responsive to an externally provided clock and reset signal;
   a comparator that compares a count value of the counter with n-bit digital input;
   wherein the comparator compares a count value of the counter with a value of the n-bit digital input and outputs one of at least two clock signals responsive to a comparison result; and
   an analog portion separate from the digital portion, the analog portion comprising:
   a capacitor;
   plural switches that selectively connect and disconnect the capacitor from one of at least two constant current sources in response to said one of at least two clock signals from the digital portion; and
   an analog amplifier having an input coupled to the capacitor and an output that provides an analog representation of the n-bit digital input data,
   wherein the digital portion and the analog portion are connected together only through the reset signal and said at least two clock signals.

6. The digital to analog converter of claim 5, wherein, responsive to the reset signal, the counter in the digital portion is reset and the capacitor in the analog portion is discharged to a reference voltage value.

7. The digital to analog converter of claim 5, wherein the at least two clock signals generated in the digital portion comprise three clock signals that are applied to associated switches of the plurality of switches in the analog portion.

8. The digital to analog converter of claim 5, further comprising:
   a selection circuit; and
   an ovesampling circuit that receives the n-bit digital input and outputs oversample data, wherein, depending on a value of the n-bit digital input, the selection circuit applies the oversample data to the comparator, and wherein the comparator outputs said one of at least two clock signals responsive to said comparison result until the count value and the oversample data value match each other.

9. The digital to analog converter of claim 8, wherein the oversampling circuit comprises a circuit that performs a convolutional arithmetic operation on data of a basic waveform having an amplitude depending on values of n pieces of input discrete data.

10. The digital to analog converter of claim 8, wherein the oversampling circuit comprises a circuit that performs a moving average arithmetic operation on data of a basic waveform having an amplitude depending on values of n pieces of input discrete data.

* * * * *